(12) United States Patent
Yoshizawa et al.

(10) Patent No.: US 7,508,258 B2
(45) Date of Patent: Mar. 24, 2009

(54) AMPLIFIER CIRCUIT

(75) Inventors: Hirokazu Yoshizawa, Fukaya (JP);
Ryoichi Anzai, Chiba (JP); Toshiyuki Uchida, Chiba (JP); Akira Takeda, Chiba (JP); Minoru Ariyama, Chiba (JP); Atsushi Igarashi, Chiba (JP)

(73) Assignees: Seiko Instruments Inc., Chiba (JP); Gakkouhoujin Chikoujigakuen, Saitama (JP)

( * ) Notice: Subject to any disclaimer, the term of this patent is extended or adjusted under 35 U.S.C. 154(b) by 72 days.

(21) Appl. No.: 11/703,026

(22) Filed: Feb. 6, 2007

(65) Prior Publication Data
US 2007/0222509 A1    Sep. 27, 2007

(30) Foreign Application Priority Data
Feb. 7, 2006    (JP) .............................. 2006-029138

(51) Int. Cl.
*H03F 1/02*    (2006.01)
(52) U.S. Cl. .......................................................... 330/9
(58) Field of Classification Search ..................... 330/9; 327/124
See application file for complete search history.

(56) References Cited

U.S. PATENT DOCUMENTS 5,621,319 A * 4/1997 Bilotti et al. ................. 324/251

OTHER PUBLICATIONS

P. Allen and D.R. Holberg, "CMOS Analog Circuit Design," pp. 490-494, Saunders College Publishing, 1987.

* cited by examiner

*Primary Examiner*—Steven J Mottola
(74) *Attorney, Agent, or Firm*—Brinks Hofer Gilson & Lione

(57) ABSTRACT

Provided is a chopper amplifier circuit capable of eliminating an influence of a slew rate of an amplifier and suppressing spike generation to thereby obtain an output signal having little harmonic distortion. The chopper amplifier circuit according to the present invention includes: a first chopper circuit for chopping an input signal by a first pulse and a second pulse shifted from each other in phase by a half cycle, switching a relation of connection between an input terminal pair and an output terminal pair at a timing of the chopping, and outputting the input signal as a modulated signal; an amplifier for amplifying the modulated signal and outputting the modulated signal thus amplified as an amplified signal; a first sample hold circuit for holding the amplified signal at the first pulse and outputting the amplified signal at the second pulse; and a second sample hold circuit for holding the amplified signal at the second pulse and outputting the amplified signal at the first pulse.

4 Claims, 10 Drawing Sheets

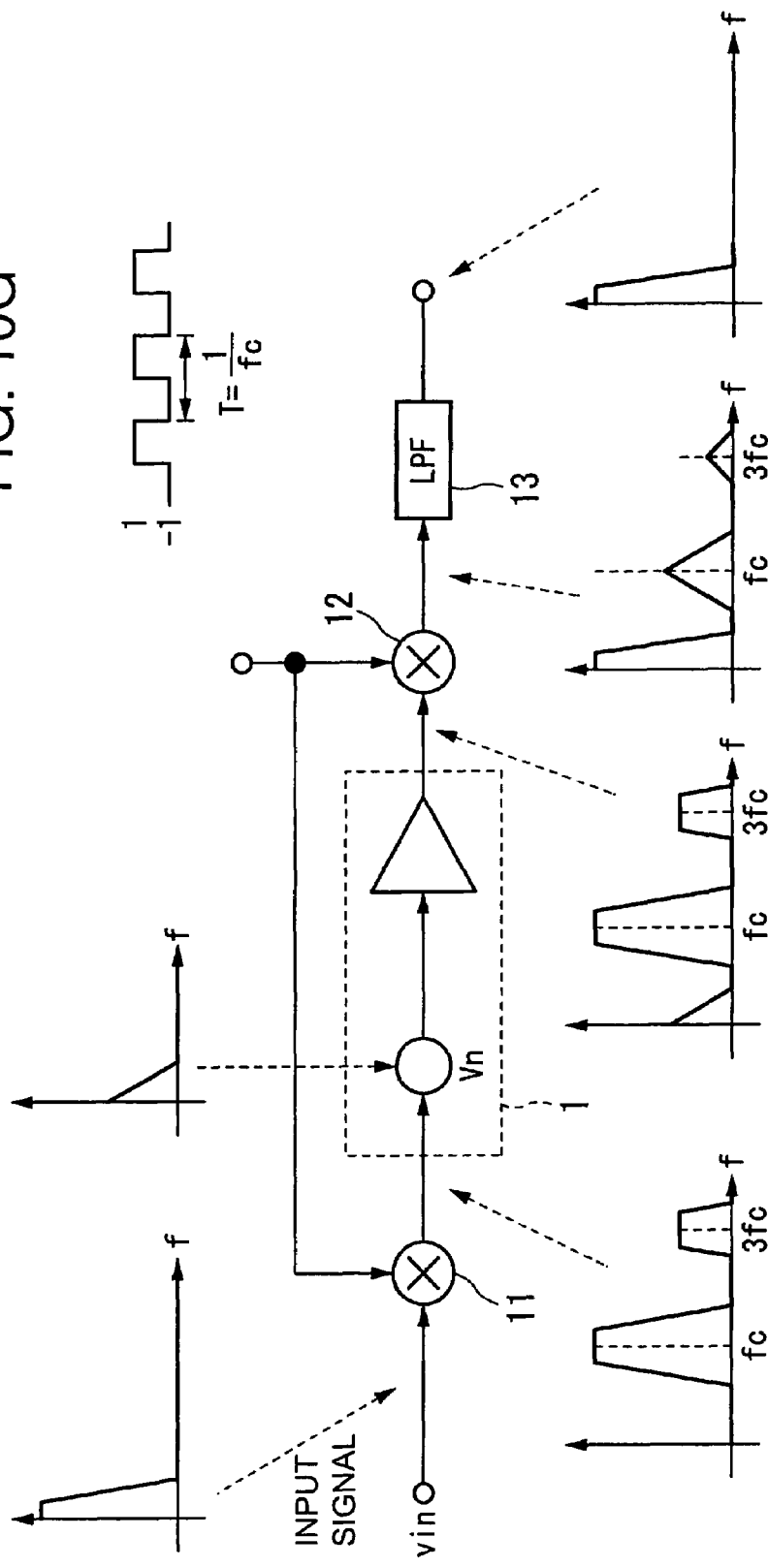

AMPLIFIER CIRCUIT

This application claims priority under 35 U.S.C. §119 to Japanese Patent Application No. JP2006-029138 filed Feb. 7, 2006, the entire content of which is hereby incorporated by reference.

BACKGROUND OF THE INVENTION

1. Field of the Invention

The present invention relates to a chopper amplifier circuit capable of reducing a DC offset and noise in an amplifier, and more particularly, to a chopper amplifier circuit capable of reducing an influence of spike noise.

2. Description of the Related Arts

A chopper amplifier circuit has widely been used as a low-noise low-drift DC amplifier.

A conventional chopper amplifier includes, as shown in FIG. 9A, an amplifier 1 and chopper circuits 11 and 12 provided at a preceding stage and a subsequent stage of the amplifier 1, respectively, so as to attain low-noise amplification.

The chopper circuit 11 employs four switching means, which are turned on and off in accordance with pulses φ1 and φ2 shown in FIG. 9B. The pulses φ1 and φ2 are rectangular pulses shifted in phase. The switching means are controlled in a cycle based on the pulses φ1 and φ2 so as to determine which of input signals inputted to input terminals 15 and 16 is inputted to which of a plus (+) input terminal and a minus (−) input terminal of the amplifier 1.

For example, when each of the switches of the chopper circuit 11 is set to be turned on at a pulse of level "H" and to be turned off at a level "L" with no pulse inputted, a line connection status of the circuit changes as follows. Note that the chopper circuit 11 includes switches 11a and 11b which are controlled by the pulse φ1 and switches 11c and 11d which are controlled by the pulse φ2.

Between a time t1 and a time t2, the pulse φ1 is at the level "H" while the pulse φ2 is at the level "L". Accordingly, the switches 11a and 11b are turned on and the switches 11c and 11d are turned off. In this state, the input terminal 15 is connected to the plus (+) input terminal of the amplifier 1, and the input terminal 16 is connected to the minus (−) input terminal of the amplifier 1.

On the other hand, between the time t2 and a time t3, the pulse φ1 is at the level "L" while the pulse φ2 is at the level "H". Accordingly, the switches 11a and 11b are turned off and the switches 11c and 11d are turned on. In this state, the input terminal 15 is connected to the minus (−) input terminal of the amplifier 1, and the input terminal 16 is connected to the plus (+) input terminal of the amplifier 1.

Similarly to the chopper circuit 11, the chopper circuit 12 also employs four switching means, which are turned on and off in accordance with the rectangular pulses φ1 and φ2 shifted in phase. The switching means are controlled in a cycle based on the pulses φ1 and φ2 so as to determine which of output signals outputted from a plus (+) output terminal 30 and a minus (−) output terminal 31 of the amplifier 1 is inputted to which of output terminals 17 and 18.

For example, similarly to the chopper circuit 11, when each of the switches of the chopper circuit 12 is set to be turned on at a pulse of level "H" and to be turned off at a level "L" with no pulse inputted, a line connection status of the circuit changes as follows. Note that the chopper circuit 12 includes switches 12a and 12b which are controlled by the pulse φ1 and switches 12c and 12d which are controlled by the pulse φ2.

Between the time t1 and the time t2, the pulse φ1 is at the level "H" while the pulse φ2 is at the level "L". Accordingly, the switches 12a and 12b are turned on and the switches 12c and 12d are turned off. In this state, the plus (+) output terminal 30 of the amplifier 1 is connected to the output terminal 17, and the minus (−) output terminal 31 of the amplifier 1 is connected to the output terminal 18.

On the other hand, between the time t2 and the time t3, the pulse φ1 is at the level "L" while the pulse φ2 is at the level "H". Accordingly, the switches 12a and 12b are turned off and the switches 12c and 12d are turned on. In this state, the minus (−) output terminal 31 of the amplifier 1 is connected to the output terminal 17, and the plus (+) output terminal 30 of the amplifier 1 is connected to the output terminal 18.

Next, with reference to FIGS. 10A to 10F, noise and frequency characteristics of input signals at each portion of the conventional chopper amplifier circuit of FIG. 9A will be described. FIGS. 10A to 10F are graphs each showing frequency characteristics at each portion (vertical axis: amplitude, horizontal axis: frequency). Also, FIG. 10G shows the pulses (φ1 and φ2 of FIG. 9B which are inputted to the chopper circuits 11 and 12. In this case, the amplifier 1 has input conversion noise and an offset voltage Vn shown in FIG. 10C. The chopper circuits 11 and 12 each modulate a signal through chopper processing based on the frequency of the pulses φ1 and φ2 (a rectangular wave of frequency fc).

That is, an input signal vin inputted with frequency characteristics of FIG. 10A is subjected to modulation at the chopper circuit 11 based on the pulses φ1 and φ2, so as to be converted into a modulated signal of frequency characteristics shown in FIG. 10B. In this case, the input signal is modulated to have a frequency of an odd-multiple of the frequency of the pulses φ1 and φ2 which control the chopper processing performed in the chopper circuit 11.

Then, in the amplifier 1, the input conversion noise and the offset voltage Vn of FIG. 10C are superimposed on (added to) the modulated signal to be outputted from the amplifier 1 as an amplified signal shown in FIG. 10D. After that, the chopper circuit 12 demodulates the amplified signal into the frequency band of the input signal (low-frequency range including direct current) based on the pulses φ1 and φ2, and outputs the signal as an output signal of frequency characteristics shown in FIG. 1E. At this time, the chopper circuit 12 modulates the input conversion noise and the offset voltage Vn of the amplifier 1 to have a frequency of an odd-multiple of the frequency of the pulses φ1 and φ2 used for the demodulation.

As described above, the output signal outputted from the chopper circuit 12 eventually includes a frequency component of an odd-multiple of the frequency of the pulses φ1 and φ2. In order to remove a high-frequency component included in the output signal, that is, the frequency component of an odd-multiple of the frequency of the pulses φ1 and φ2, a low-pass filter 13 is provided at an output stage, to thereby obtain an output signal having frequency characteristics shown in FIG. 10F (see, for example, P. Allen and D. R. Holberg, CMOS Analog Circuit Design, pp. 490-494, Saunders College Publishing, 1987, hereinafter referred to as Non-Patent Document 1).

In other words, the chopper amplifier circuit described above suppresses an influence of the input conversion noise and the offset voltage Vn of the amplifier 1 to thereby amplify only the frequency component of an input signal.

However, the chopper amplifier circuit described in Non-Patent Document 1 has a drawback in that it is impossible to completely remove spike components included in the output signal through the low-pass filter 13, leading to a harmonic distortion.

In the conventional chopper amplifier circuit, the spike components are generated in the output signal due to the following mechanism.

In the chopper amplifier circuit of FIG. 9A, the input terminal 15 is supplied with an input signal having a sinusoidal wave shown in FIG. 11, while the input terminal 16 is supplied with an input signal having a sinusoidal wave shown in FIG. 12. In each of FIGS. 11 and 12, the vertical axis is a voltage scale and the horizontal axis is a time scale.

The input signal is modulated at the chopper circuit 11, amplified by the amplifier 1, and demodulated at the chopper circuit 12, before being outputted from the output terminal 17 as an output signal. FIG. 13 shows the output signal thus outputted. In FIG. 13, the vertical axis is a voltage scale and the horizontal axis is a time scale.

As is apparent from the waveform of FIG. 13, a large spike components are generated at timings when each of the switches in the chopper amplifier circuits 11 and 12 are switched in accordance with the pulses $\phi1$ and $\phi2$.

The spike components are generated due to a slew rate of the amplifier 1. Specifically, FIG. 14 shows an amplified signal outputted from the plus (+) output terminal 30 of the amplifier 1, and FIG. 15 shows an amplified signal outputted from the minus (−) output terminal 31. In each of FIGS. 14 and 15, the vertical axis is a voltage scale and the horizontal axis is a time scale.

It is evident from FIGS. 14 and 15 that the signal level of the amplified signal significantly fluctuates in voltage when the signal is modulated at the chopper circuit 11.

During the period when the pulse $\phi1$ is at the level "H" and the pulse $\phi2$ is at the level "L", the chopper circuit 12 samples the amplified signal of FIG. 14 which has been outputted from the plus (+) output terminal 30, and outputs the signal. Alternatively, during the period when the pulse $\phi1$ is at the level "L" and the pulse $\phi2$ is at the level "H", the chopper circuit 12 samples the amplified signal of FIG. 15 which has been outputted from the minus (−) output terminal 31, and outputs the signal.

In those cases, when the signal is demodulated at the chopper circuit 12, the voltage fluctuation of the amplified signals each outputted from the plus (+) output terminal 30 and the minus (−) output terminal 31, respectively, is synthesized with the demodulated signal because the slew rate of the amplifier 1 is finite. Therefore, the large spike components are generated in the signal.

SUMMARY OF THE INVENTION

The present invention has been made in view of the above-mentioned circumstances, and therefore, it is an object of the present invention to provide a chopper amplifier circuit capable of obtaining an output signal obtained from an input signal alone, the output signal having no harmonic distortion as compared with a conventional example, by eliminating an influence of a slew rate of an amplifier and suppressing spike generation.

In order to attain the above-mentioned object, according to an aspect of the present invention, there is provided a chopper amplifier circuit, including: a chopper circuit for chopping an input signal based on a pulse having a predetermined frequency so as to modulate the input signal; an amplifier for amplifying the input signal thus modulated; a first sample hold circuit; and a second sample hold circuit, in which: the chopper amplifier circuit demodulates the modulated signal thus amplified, and outputs the signal thus amplified as an output signal; the chopper circuit chops the input signal by a first pulse and a second pulse shifted from each other in phase by a half cycle, switches a relation of connection between an input terminal pair and an output terminal pair at a timing of the chopping (for example, according to an embodiment of the present invention, the timing at which a pulse $\phi1$ shifts from a level "H" to a level "L" and a pulse $\phi2$ shifts from the level "L" to the level "H", or the pulse $\phi1$ shifts from the level "L" to the level "H" and the pulse $\phi2$ shifts from the level "H" to the level "L", that is, the timing at which one of the pulses $\phi1$ and $\phi2$ shifted in phase by a half cycle is outputted), and outputs the input signal as a modulated signal; the amplifier amplifies the modulated signal and outputs the modulated signal thus amplified as an amplified signal; the first sample hold circuit holds the amplified signal at the first pulse and outputs the amplified signal at the second pulse; and the second sample hold circuit holds the amplified signal at the second pulse and outputs the amplified signal at the first pulse.

In the chopper amplifier circuit according to the present invention, the first sample hold circuit and the second sample hold circuit each include: a first switch pair into which the amplified signal is inputted; a hold circuit for holding a voltage level of the amplified signal inputted from the first switch pair; and a second switch pair for controlling an output of the amplified signal held by the hold circuit, one of the first switch pair and the second switch pair being turned off while the other one of the first switch pair and the second switch pair is turned on.

In the chopper amplifier circuit according to the present invention, the input terminal pair is composed of a first input terminal and a second input terminal, and the output terminal pair is composed of a first output terminal and a second output terminal. The first input terminal and the first output terminal are connected to each other and the second input terminal and the second output terminal are connected to each other, when the first pulse is inputted, and the first input terminal and the second output terminal are connected to each other and the second input terminal and the first output terminal are connected to each other, when the second pulse is inputted.

In the chopper amplifier circuit according to the present invention, the first sample hold circuit and the second sample hold circuit each hold a voltage level of the amplified signal due to a configuration of a switched capacitor.

In the chopper amplifier circuit according to the present invention, the first switch pair and the second switch pair, which have output terminals connected to each other, each synthesize the amplified signals outputted from each hold circuit in each of the first sample hold circuit and the second sample hold circuit based on the first pulse and the second pulse, and output the synthesized signal as an output signal.

As described above, in the chopper amplifier circuit according to the present invention, a switch matrix of the chopper circuit is changed based on the first and second pulses shifted in phase by a half cycle, the relation of connection between the input terminal and the output terminal is switched, and a modulated signal obtained by chopping an input signal is amplified, before the amplified signal is alternately sampled and held at two sample hold circuits, i.e., the first and second sample hold circuits based on the first and second pulses. In this case, when one of the first and second sample hold circuits is outputting the amplified signal thus held, the other sample hold circuit samples the output signal from the amplifier, to thereby output an output signal obtained by synthesizing (demodulating) amplified signals outputted from the amplifier for every half cycle, the amplified signals being shifted from one another by a half cycle.

Therefore, according to the chopper amplifier circuit of the present invention, the amplified signal is read out from the hold circuit at a timing shifted by a half cycle from a timing at which the amplified signal from the amplifier is sampled, to thereby output the amplified signal in a state where the output is completely stable. Accordingly, it is possible to suppress spike generation by eliminating the influence of the slew rate of the amplifier when synthesizing the amplified signal.

As described above, the chopper amplifier circuit of the present invention is provided with the sample hold circuit connected in tandem at a subsequent stage of the amplifier, so the amplified signal outputted from the amplifier is temporarily held to eliminate the influence of the slew rate of the amplifier so as to prevent spike component generation, thereby producing an effect of reducing a harmonic distortion included in the output signal which has been outputted through the low-pass filter, as compared with the conventional example.

BRIEF DESCRIPTION OF THE DRAWINGS

In the accompanying drawings:

FIGS. 10A to 10G each are a schematic diagram for explaining frequency characteristics of a signal at each portion of the chopper amplifier circuit of FIG. 9A;

DETAILED DESCRIPTION OF THE PREFERRED EMBODIMENTS

Figure 1:
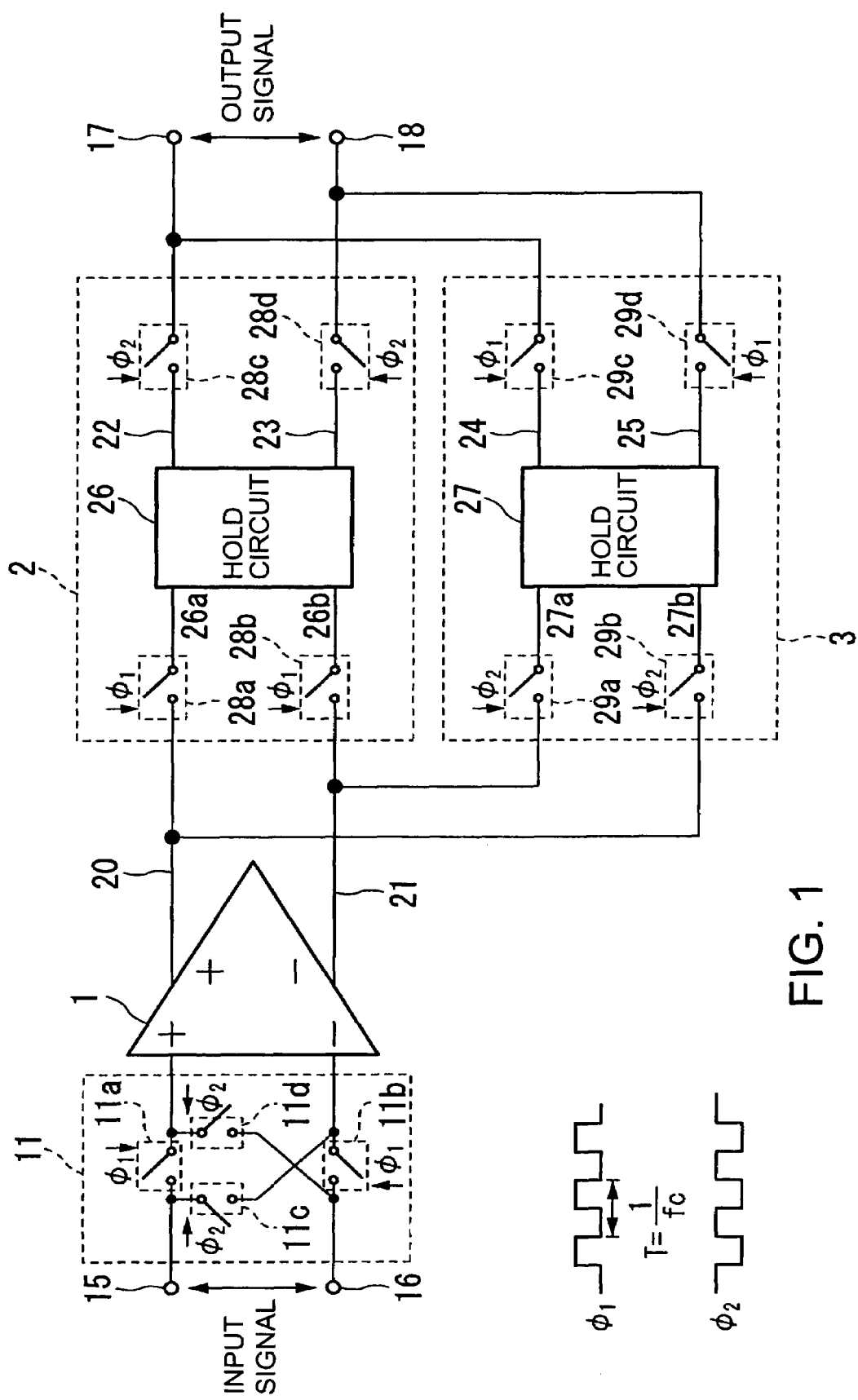
FIG. 1 is a block diagram showing a configuration example of a chopper amplifier circuit according to an embodiment of the present invention.

Hereinafter, a chopper amplifier circuit according to an embodiment of the present invention is explained with reference to the accompanying drawings. FIG. 1 is a block diagram showing a configuration example of the chopper amplifier circuit according to this embodiment.

Figure 9A:
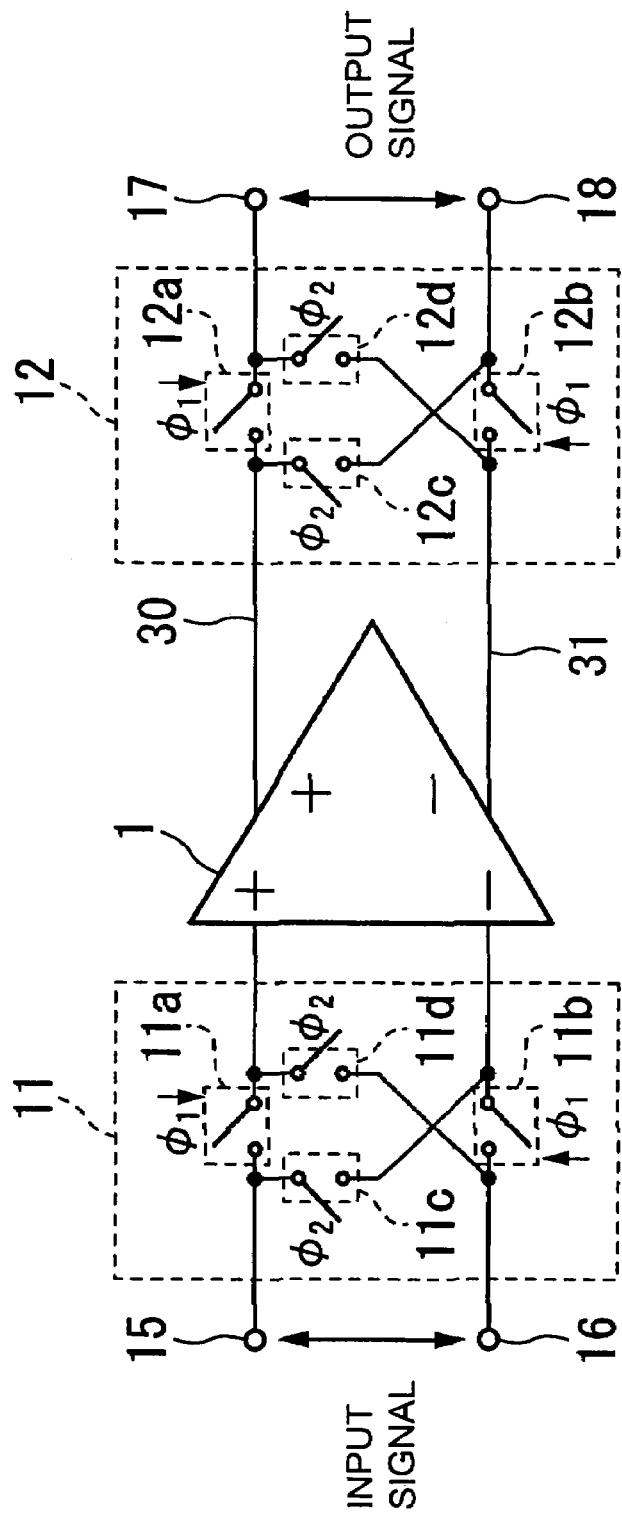
FIG. 9A is a block diagram showing a configuration of a conventional chopper amplifier circuit.
Figure 9B:
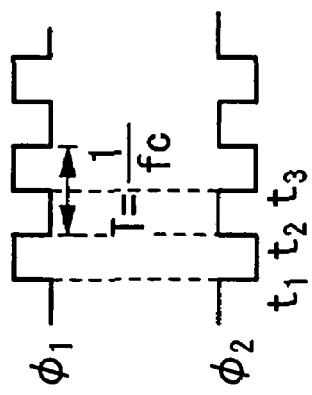
FIG. 9B is a diagram for explaining pulses ($\phi 1$ and $\phi 2$)

In the drawing, the components similar to those of a conventional example of FIG. 9A are denoted by the same reference symbols and an explanation thereof is omitted. That is, a chopper circuit 11 and an amplifier 1 are similar to those in the conventional example of FIG. 9A. The circuit of FIG. 1 is different from the conventional example in that the circuit includes sample hold circuits 2 and 3 connected in parallel, in place of the chopper circuit 12 in the conventional example, at the subsequent stage of the amplifier 1.

The circuit of this embodiment operates similarly to the conventional example, so a brief explanation is given on a configuration of the chopper circuit 11.

The chopper circuit 11 includes a switch matrix formed of switches 11a, 11b, 11c, and 11d. The switches 11a and 11b are turned on when a pulse $\phi 1$ is at the level "H" while the switches 11c and 11d are turned on when a pulse $\phi 2$ is at the level "H".

The switch 11a is provided between an input terminal 15 and a plus (+) input terminal of the amplifier 1, and the switch 11b is provided between an input terminal 16 and a minus (−) input terminal of the amplifier 1. The switch 11c is provided between the input terminal 15 and the minus (−) input terminal of the amplifier 1, and the switch 11d is provided between the input terminal 16 and the plus (+) input terminal of the amplifier 1.

The sample hold circuit 2 holds voltage levels of a plus (+) output terminal 20 and a minus (−) output terminal 21 of the amplifier 1 when the pulse $\phi 1$ is at the level "H" and the pulse $\phi 2$ is at the level "L", and outputs the voltage levels thus held when the pulse $\phi 1$ is at the level "L" and the pulse $\phi 2$ is at the level "H".

Similarly, the sample hold circuit 2 holds voltage levels of the plus (+) output terminal (positive side output terminal) 20 and the minus (−) output terminal (negative side output terminal) 21 of the amplifier 1 when the pulse $\phi 1$ is at the level "L" and the pulse $\phi 2$ is at the level "H", and outputs the voltage levels thus held when the pulse $\phi 11$ is at the level "H" and the pulse $\phi 2$ is at the level "L".

The sample hold circuit 2 includes switches 28a and 28b which constitute an input switch pair on the input side, a hold circuit 26, and switches 28c and 28d which constitute an output switch pair on the output side.

The switch 28a, which is provided in series between the amplifier 1 and the hold circuit 26, connects to the plus (+) output terminal 20 of the amplifier 1 at the input side terminal thereof and to an input terminal 26a of the hold circuit 26 at the output side terminal thereof. The switch 28b, which is provided in series between the amplifier 1 and the hold circuit 26, connects to the minus (−) output terminal 21 of the amplifier 1 at the input side terminal thereof and to an input terminal 26b of the hold circuit 26 at the output side terminal thereof.

The switch 28c, which is provided in series between the hold circuit 26 and an output terminal 17, connects to the output terminal 22 (positive side output terminal) of the hold circuit 26 at the input side terminal thereof and to the output terminal 17 at the output side terminal thereof. The switch 28d, which is provided in series between the hold circuit 26 and an output terminal 18, connects to the output terminal 23 (negative side output terminal) of the hold circuit 26 at the input side terminal thereof and to the output terminal 18 at the output side terminal thereof.

The switches 28a and 28b are turned on when the pulse $\phi 1$ is at the level "H" and turned off when the pulse $\phi 2$ is at the level "H". The switches 28c and 28d are turned off when the pulse φ1 is at the level "H" and turned on when the pulse φ2 is at the level "H".

Similarly, the sample hold circuit 3 includes switches 29a and 29b which constitute an input switch pair on the input side, a hold circuit 27, and switches 29c and 29d which constitute an output switch pair on the output side.

The switch 29a, which is provided in series between the amplifier 1 and the hold circuit 27, connects to the minus (−) output terminal 21 of the amplifier 1 at the input side terminal thereof and to an input terminal 27a of the hold circuit 27 at the output side terminal thereof. The switch 29b, which is provided in series between the amplifier 1 and the hold circuit 27, connects to the plus (+) output terminal 20 of the amplifier 1 at the input side terminal thereof and to an input terminal 27b of the hold circuit 27 at the output side terminal thereof.

The switch 29c, which is provided in series between the hold circuit 27 and an output terminal 17, connects to the output terminal 24 (negative side output terminal) of the hold circuit 27 at the input side terminal thereof and to the output terminal 17 at the output side terminal thereof. The switch 29d, which is provided in series between the hold circuit 27 and the output terminal 18, connects to the output terminal 25 (positive side output terminal) of the hold circuit 27 at the input side terminal thereof and to the output terminal 18 at the output side terminal thereof.

The switches 29a and 29b are turned off when the pulse φ1 is at the level "H" and turned on when the pulse φ2 is at the level "H". The switches 29c and 29d are turned on when the pulse φ1 is at the level "H" and turned off when the pulse φ2 is at the level "H".

Next, an operational example of this embodiment is explained with reference to FIG. 1.

Figure 11:
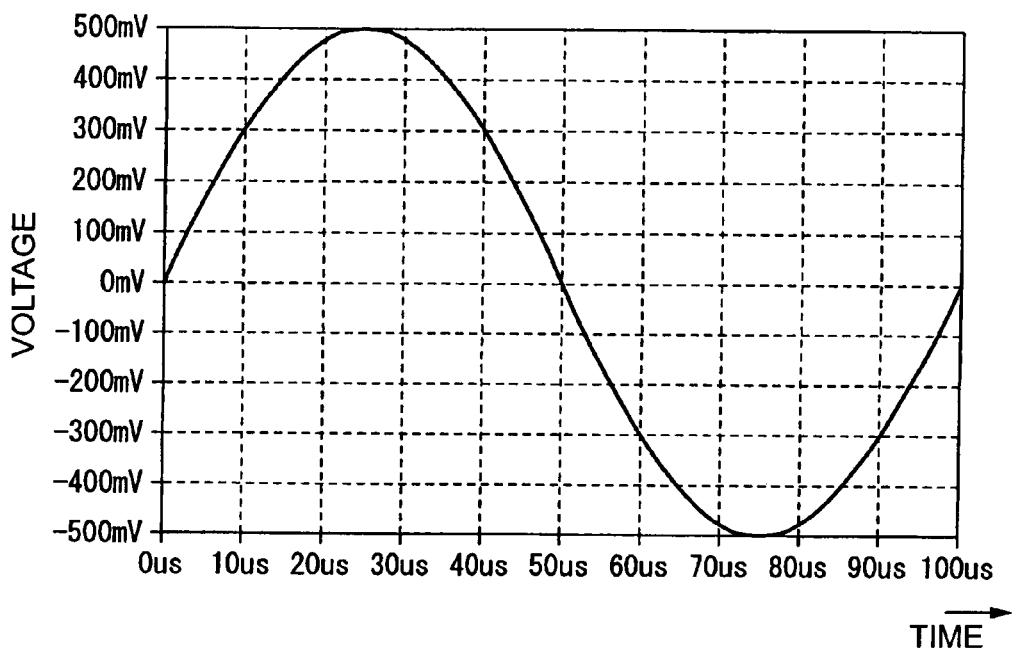
FIG. 11 is a waveform chart showing a waveform of an input signal to be inputted to an input terminal (15)
Figure 12:
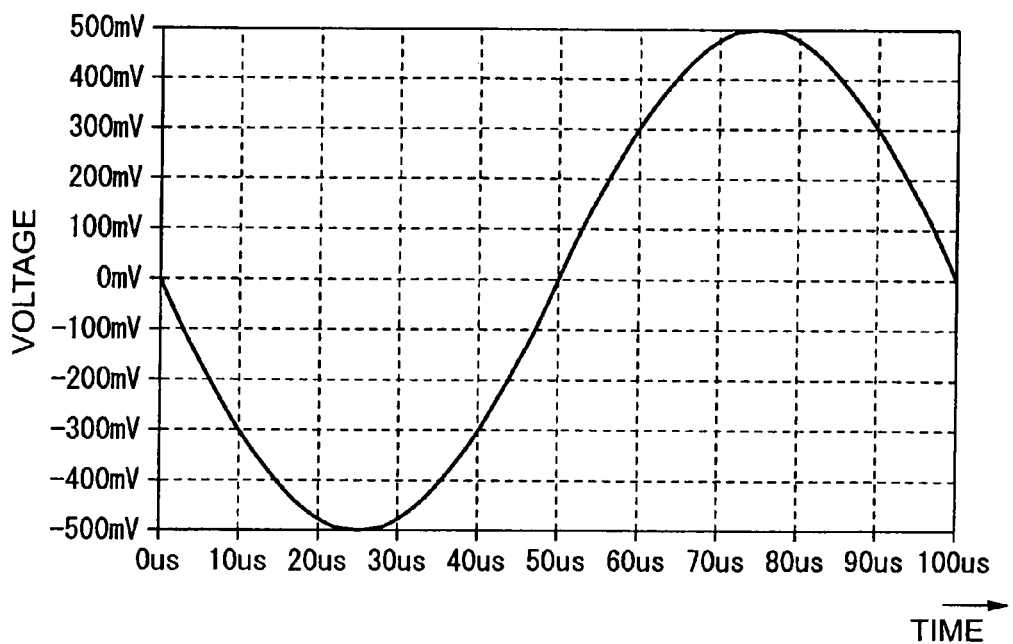
FIG. 12 is a waveform chart showing a waveform of an input signal to be inputted to an input terminal (16)
Figure 13:
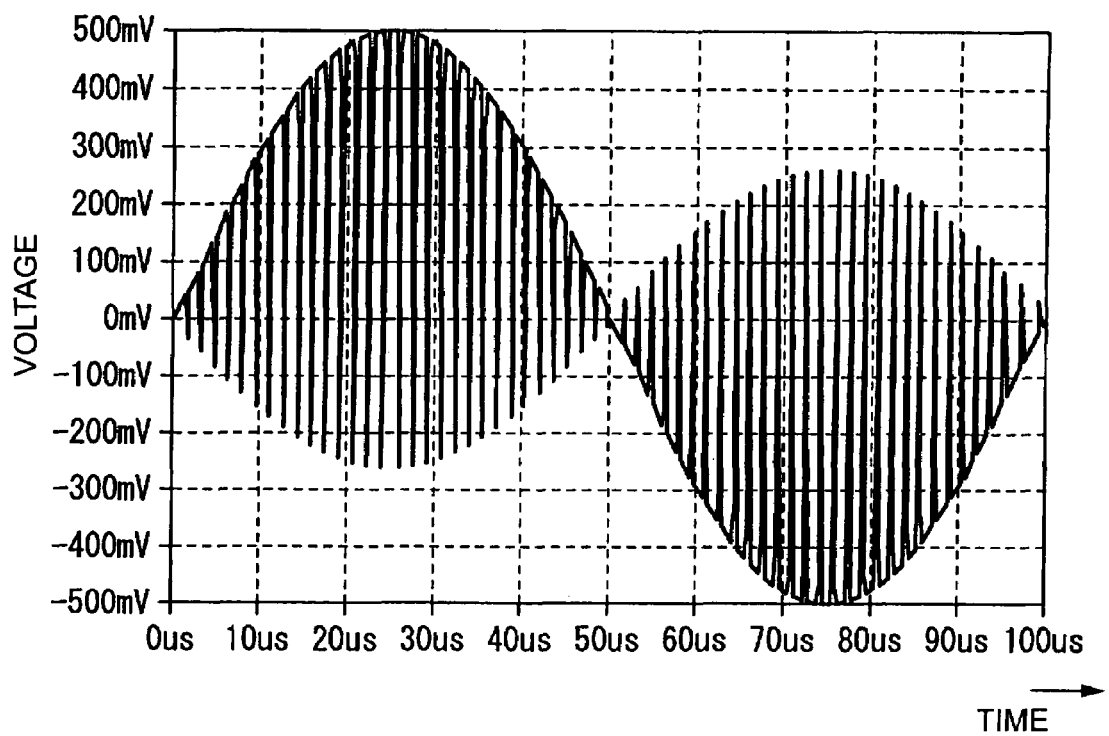
FIG. 13 is a waveform chart showing a waveform of an output signal to be outputted from the output terminal (17) of FIG. 9A.
Figure 14:
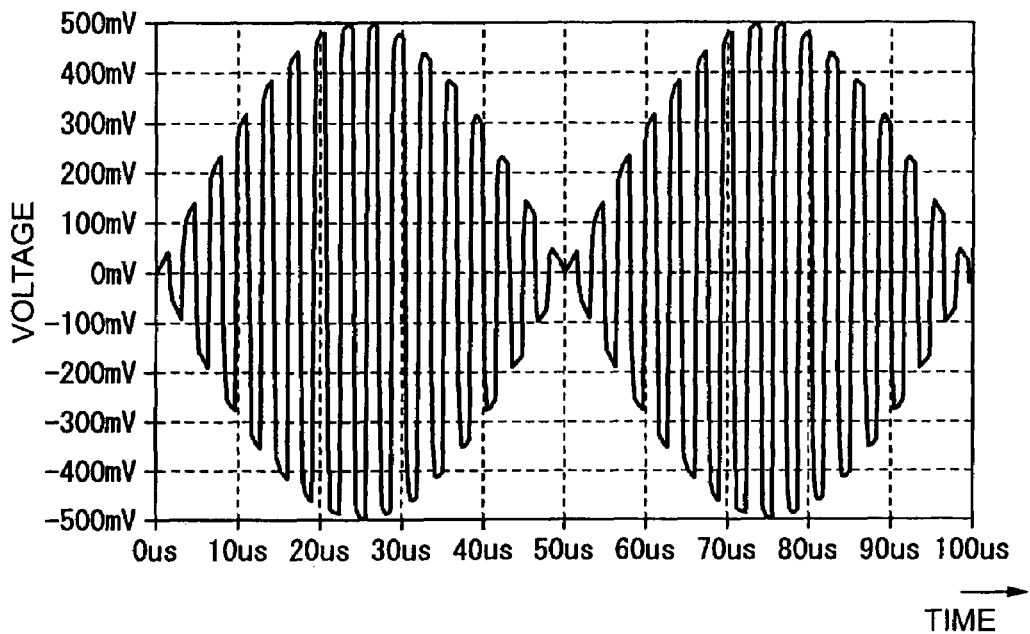
FIG. 14 is a waveform chart showing a waveform of an amplified signal outputted from a plus (+) output terminal (30) of the amplifier (1) of FIG. 9A.
Figure 15:
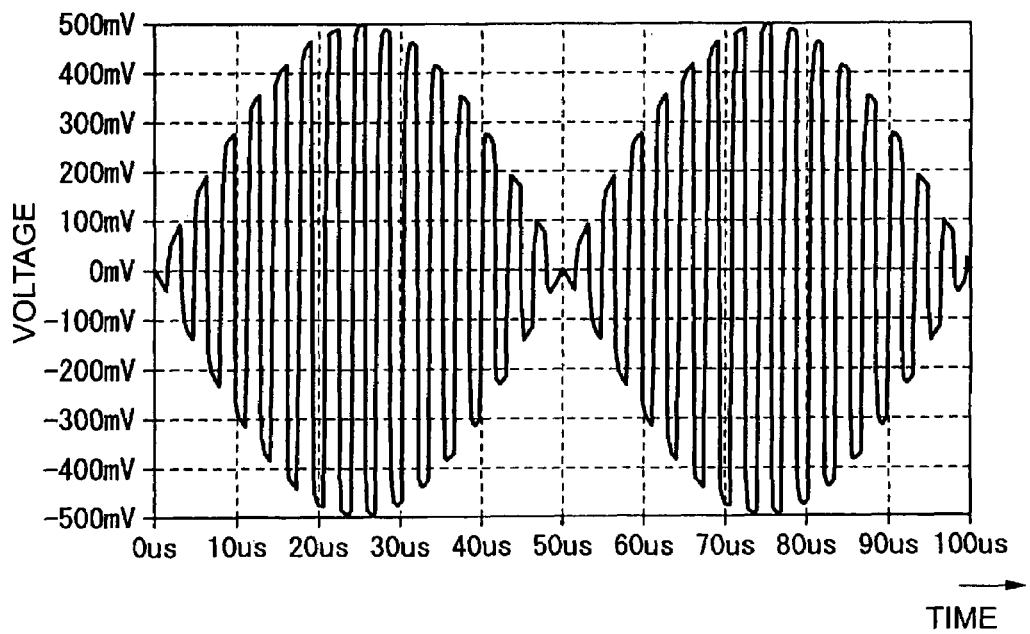
FIG. 15 is a waveform chart showing a waveform of an amplified signal outputted from a minus (−) output terminal (31) of the amplifier (1) of FIG. 9A.

As explained in the conventional example, in the chopper amplifier circuit of this embodiment shown in FIG. 1, the input terminal 15 is supplied with an input signal having a sinusoidal wave shown in FIG. 11, while the input terminal 16 is supplied with an input signal having a sinusoidal wave shown in FIG. 12. Operations of the chopper circuit 11 and the amplifier 1 are similar to those of the conventional example, and therefore explanations thereof are omitted. As in the conventional example, the pulses φ1 and φ2 are shifted (different) from each other in phase by a half cycle, that is, "π (180 degrees)".

Each of the input signals is modulated at the chopper circuit 11, amplified by the amplifier 1 up to a predetermined magnification of, for example, 10 times, and outputted to the plus (+) output terminal 20 and the minus (−) output terminal 21.

In this state, due to the switch matrix (switches 11a to 11d) of the chopper circuit 11, at the pulse φ1 of level "H" and the pulse φ2 of level "L", a voltage difference between a voltage Vinp inputted from the input terminal 15 and a voltage Vinn inputted from the input terminal 16, that is, "Vinp−Vinn", is amplified by the amplifier 1, the voltage difference Voutp thus amplified is outputted from the plus (+) output terminal 20 to be inverted to a voltage difference Voutn, and the voltage difference Voutn thus inverted is outputted from the minus (−) output terminal 21.

Similarly, at the pulse φ1 of level "L" and the pulse φ2 of level "H", a voltage difference between a voltage Vinp inputted from the input terminal 15 and a voltage Vinn inputted from the input terminal 16, that is, "Vinn−Vinp", is amplified by the amplifier 1, the voltage difference Voutp thus amplified is outputted from the plus (+) output terminal 20 to be inverted to a voltage difference Voutn, and the voltage difference Voutn thus inverted is outputted from the minus (−) output terminal 21.

Figure 2:
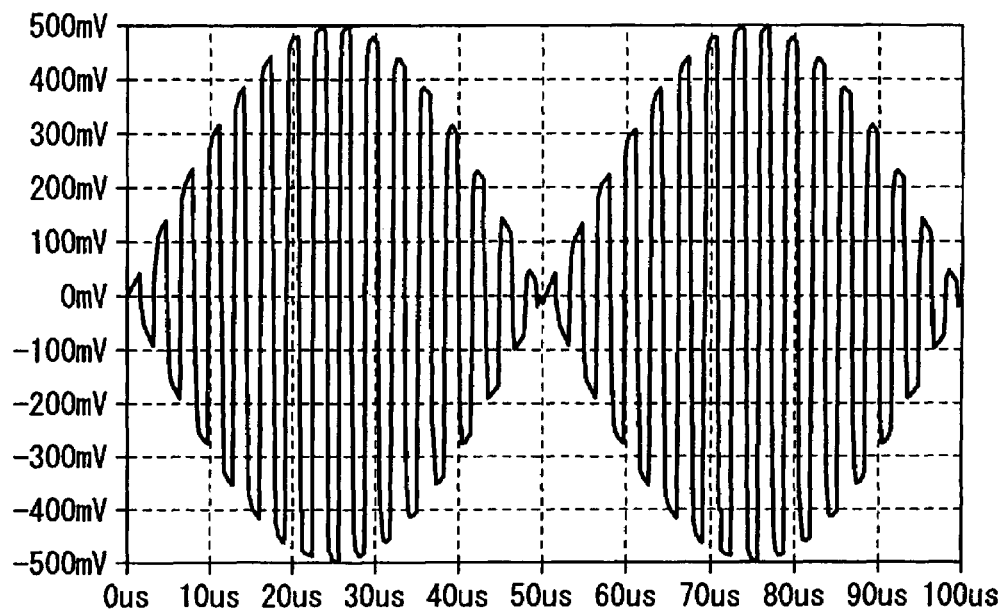
FIG. 2 is a waveform chart of an amplified signal outputted from a plus (+) output terminal (20) of an amplifier (1) shown in FIG. 1.
Figure 3:
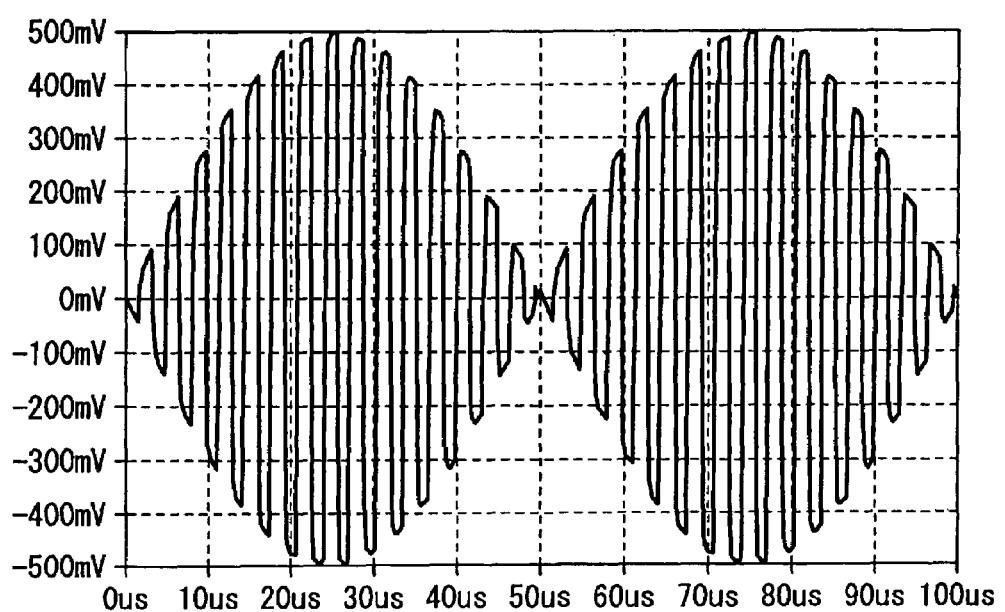
FIG. 3 is a waveform chart of an amplified signal outputted from a minus (−) output terminal (21) of the amplifier (1) shown in FIG. 1.

Due to the chopping control executed in accordance with the pulses φ1 and φ2 as described above, the voltage difference Voutp having a signal waveform of FIG. 2 is outputted from the plus (+) terminal 20 of the amplifier 1, and the voltage difference Voutn having a signal waveform of FIG. 3 is outputted from the minus (−) terminal 21 of the amplifier 1. In each of FIGS. 2 and 3, the vertical axis is a voltage scale and the horizontal axis is a time scale.

When the pulse φ1 is at the level "H" and the pulse φ2 is at the level "L", the switches 28a and 28b constituting the input switch pair in the sample hold circuit 2 and the switches 29c and 29d constituting the output switch pair in the sample hold circuit 3 are turned on. At the same time, the switches 28c and 28d constituting the output switch pair in the sample hold circuit 2 and the switches 29a and 29b constituting the input switch pair in the sample hold circuit 3 are turned off.

Accordingly, the hold circuit 26 has the input terminal 26a connected to the plus (+) side output terminal 20 of the amplifier 1 and the input terminal 26b connected to the minus (−) side output terminal 21 of the amplifier 1. In this state, the hold circuit 26 holds the voltage difference Voutp inputted from the input terminal 26a and outputs the voltage difference Voutp from the output terminal 22. The hold circuit 26 also holds the voltage difference Voutn inputted from the input terminal 26b and outputs the voltage difference Voutn from the output terminal 23.

However, the switches 28c and 28d constituting the output switch pair of the sample hold circuit 2 are turned off, and accordingly, the sample hold circuit 2 does not output the voltage levels outputted from the hold circuit 26 to the output terminals 17 and 18 as output signals. In other words, the sample hold circuit 2 is sampling the voltage levels of the amplified signals from the amplifier 1.

At this time, the hold circuit 27 has the output terminal 24 connected to the output terminal 17 and the output terminal 25 connected to the output terminal 18. In this state, the hold circuit 27 outputs the voltage difference Voutn thus held to the output terminal 17 through the output terminal 24. Also, the hold circuit 27 outputs the voltage difference Voutp thus held to the output terminal 18 through the output terminal 25.

Meanwhile, the switches 29a and 29b constituting the input switch pair of the sample hold circuit 3 are turned off, and accordingly, the voltage levels of the amplified signals outputted by the amplifier 1 are not inputted to the input terminals 27a and 27b of the hold circuit 27, which means that the hold circuit 27 is in a holding state. In other words, the sample hold circuit 3 is outputting the voltage levels of the amplified signals held in the hold circuit 27.

When the pulse φ1 is at the level "L" and the pulse φ2 is at the level "H", the switches 28c and 28d constituting the output switch pair in the sample hold circuit 2 and the switches 29a and 29b constituting the input switch pair in the sample hold circuit 3 are turned on. At the same time, the switches 28a and 28b constituting the input switch pair in the sample hold circuit 2 and the switches 29c and 29d constituting the output switch pair in the sample hold circuit 3 are turned off.

Accordingly, the hold circuit 26 has the output terminal 22 connected to the output terminal 17 and the output terminal 23 connected to the output terminal 18. In this state, the hold circuit 26 outputs the voltage difference Voutp thus held to the output terminal 17 through the output terminal 22. Also, the hold circuit 26 outputs the voltage difference Voutn thus held to the output terminal 18 through the output terminal 23.

Meanwhile, the switches 28a and 28b constituting the input switch pair of the sample hold circuit 2 are turned off, and accordingly, the voltage levels of the amplified signals outputted by the amplifier 1 are not inputted to the input terminals 26a and 26b of the hold circuit 26, which means that the hold circuit 26 is in a holding state. In other words, the sample hold circuit 2 is outputting the voltage levels of the amplified signals held in the hold circuit 26.

At this time, the hold circuit 27 has the input terminal 27a connected to the minus (−) side output terminal 21 of the amplifier 1 and the input terminal 27b connected to the plus (+) side output terminal 20 of the amplifier 1. In this state, the hold circuit 27 holds the voltage difference Voutn inputted from the input terminal 27a and outputs the voltage difference Voutn from the output terminal 24. The hold circuit 27 also holds the voltage difference Voutp inputted from the input terminal 27b and outputs the voltage difference Voutp from the output terminal 25.

However, the switches 29c and 29d constituting the output switch pair of the sample hold circuit 3 are turned off, and accordingly, the sample hold circuit 3 does not output the voltage levels outputted from the hold circuit 27 to the output terminals 17 and 18 as output signals. In other words, the sample hold circuit 3 is sampling the voltage levels of the amplified signals from the amplifier 1.

As described above, one of the sample hold circuit 2 and the sample hold circuit 3 outputs the voltage levels held in the other one of the circuits while the other one of the sample hold circuit 2 and the sample hold circuit 3 is sampling the voltage levels, depending on which one of the pulses φ1 and 2φ is inputted at the level "H". The sample hold circuits 2 and 3 take turns sampling and outputting for every half cycle.

Figure 4:
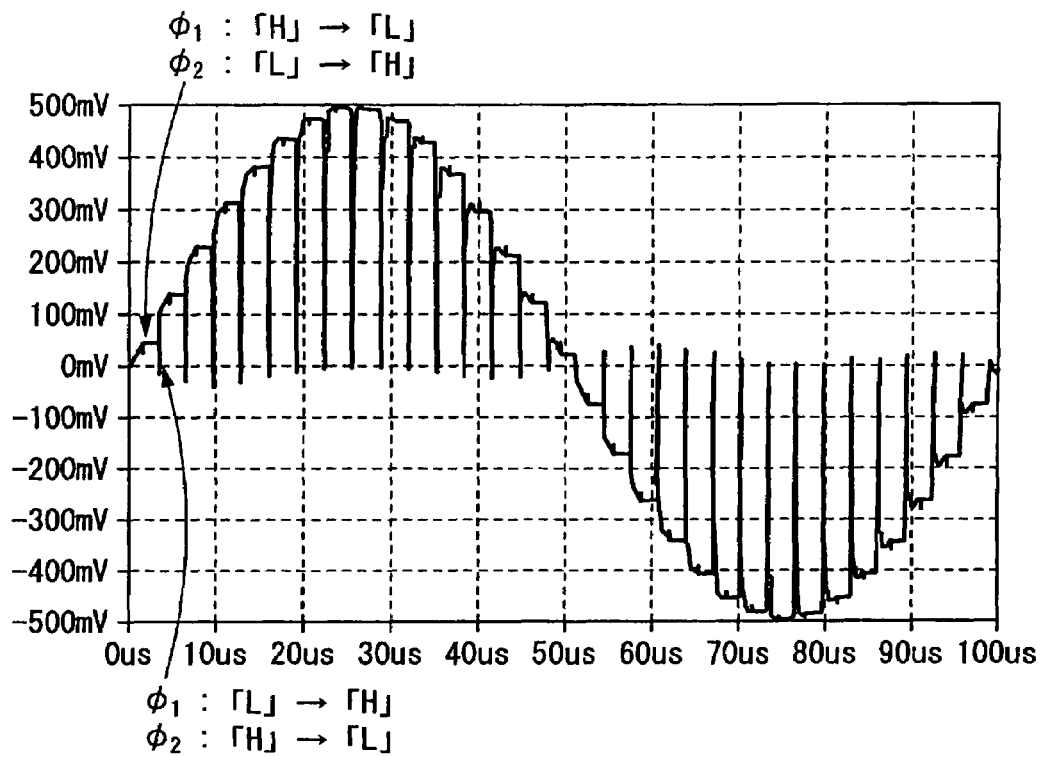
FIG. 4 is a waveform chart of a signal outputted from an output terminal (22) of a hold circuit (26) shown in FIG. 1.

FIG. 4 shows a signal waveform of a signal outputted from the output terminal 22 in the manner as described above, which is a positive side output terminal of the hold circuit 26. In FIG. 4, the vertical axis is a voltage scale and the horizontal axis is a time scale. As is apparent from FIG. 4, the output signal outputted from the output terminal 22 bears a large spike component when the pulse φ2 changes from the level "H" to the level "L" and the pulse φ1 changes from the level "L" to the level "H". In contrast, the output signal outputted from the output terminal 22 hardly bears a spike component when the pulse φ2 changes from the level "L" to the level "H" and the pulse φ1 changes from the level "H" to the level "L".

In other words, the voltage held in the hold circuit 26 greatly fluctuates when the hold circuit 26 samples the amplified signals at the pulse φ1 because of a spike component generated due to the slew rate of the amplifier 1.

However, when the hold circuit 26 outputs the amplified signal held in the circuit to the output terminal 17 at the pulse φ2 through the switch 28c, the output signal is only affected by the voltage fluctuation due to switching noise or the like at the switch 28c without being affected at all by the slew rate of the amplifier 1. Therefore, the output signal outputted from the sample hold circuit 2 bears no spike component.

Figure 5:
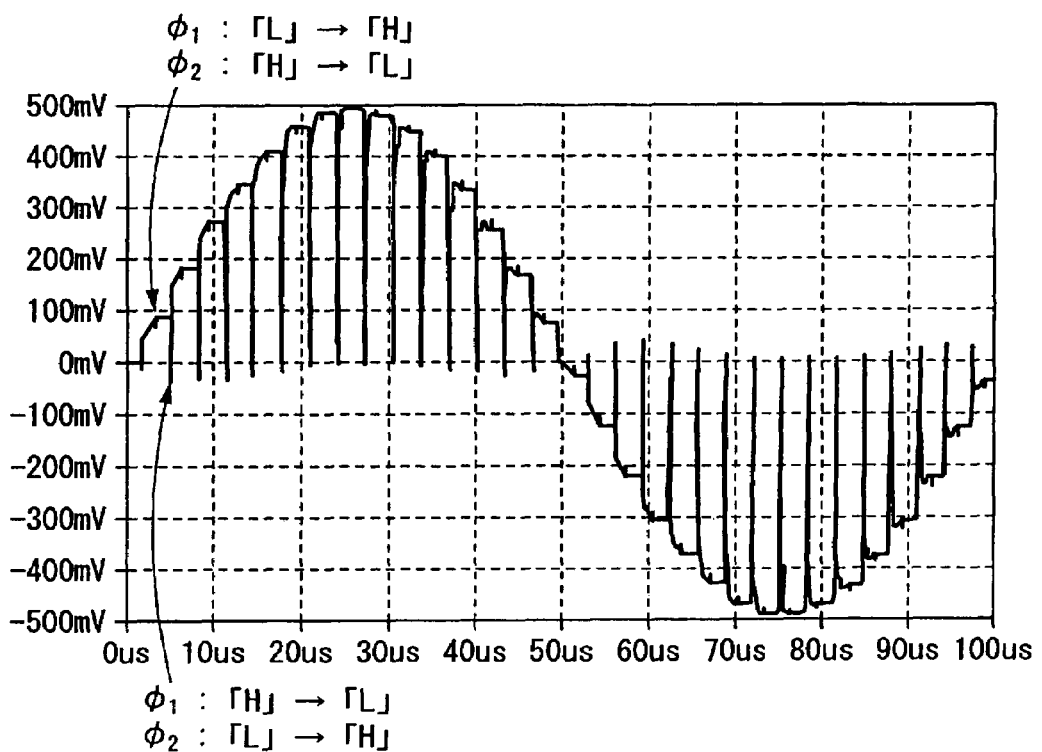
FIG. 5 is a waveform chart of a signal outputted from an output terminal (24) of a hold circuit (27) shown in FIG. 1.

Similarly, FIG. 5 shows a signal waveform of a signal outputted from the output terminal 24, which is a negative side output terminal of the hold circuit 27. In FIG. 5, the vertical axis is a voltage scale and the horizontal axis is a time scale. As is apparent from FIG. 5, the output signal outputted from the output terminal 24 bears a large spike component when the pulse φ1 changes from the level "H" to the level "L" and the pulse φ2 changes from the level "L" to the level "H". In contrast, the output signal outputted from the output terminal 24 hardly bears a spike component when the pulse φ1 changes from the level "L" to the level "H" and the pulse φ2 changes from the level "H" to the level "L".

In other words, the voltage held in the hold circuit 27 greatly fluctuates when the hold circuit 27 samples the amplified signals at the pulse φ2 because of a spike component generated due to the slew rate of the amplifier 1.

However, when the hold circuit 27 outputs the amplified signal held in the circuit to the output terminal 18 at the pulse φ1 through the switch 29d, the output signal is only affected by the voltage fluctuation due to switching noise or the like at the switch 29d without being affected at all by the slew rate of the amplifier 1. Therefore, the output signal outputted from the sample hold circuit 3 bears no spike component.

As described above, when the pulse φ2 is at the level "H" and the pulse φ1 is at the level "L", the output signal from the output terminal 22 of the hold circuit 26 is outputted to the output terminal 17 while the output signal from the output terminal 23 of the hold circuit 26 is outputted to the output terminal 18, due to the control performed over the switches in the sample hold circuits 2 and 3 based on the pulses φ1 and φ2.

On the other hand, when the pulse φ1 is at the level "H" and the pulse φ2 is at the level "L", the output signal from the output terminal 24 of the hold circuit 27 is outputted to the output terminal 17 while the output signal from the output terminal 25 of the hold circuit 27 is outputted to the output terminal 18, due to the control performed over the switches in the sample hold circuits 2 and 3 based on the pulses φ1 and φ2.

Figure 6:
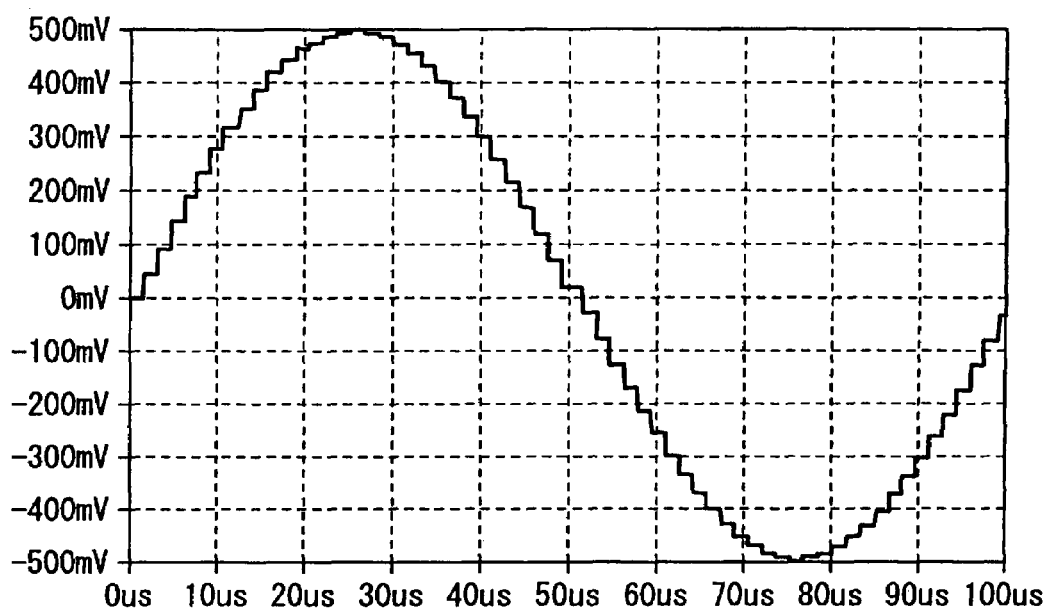
FIG. 6 is a waveform chart of an output signal outputted from an output terminal (17) shown in FIG. 1.

In the manner as described above, the sample hold circuits 2 and 3 alternately output signals in accordance with the timings of the pulses φ1 and φ2 and synthesize the signals to produce an output signal to be outputted. The output signal thus obtained is outputted from the output terminal 17. The output signal exhibits a sinusoidal waveform as shown in FIG. 6 without bearing large spike components shown in FIGS. 4 and 5.

Figure 7:
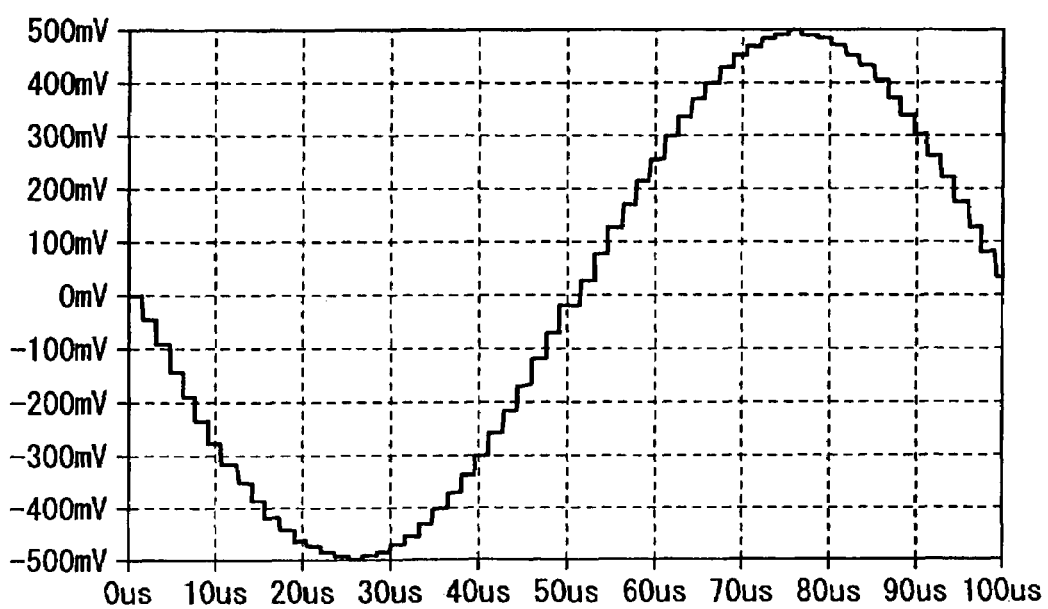
FIG. 7 is a waveform chart of an output signal outputted from an output terminal (18) shown in FIG. 1.

Similarly, the sample hold circuits 2 and 3 alternately output signals in accordance with the timings of the pulses φ1 and φ2 and synthesize the signal to produce an output signal be outputted. The output signal thus obtained is outputted from the output terminal 18. The output signal exhibits a sinusoidal waveform as shown in FIG. 7 without bearing large spike components shown in FIGS. 4 and 5. In each of FIGS. 6 and 7, the vertical axis is a voltage scale and the horizontal axis is a time scale.

Therefore, according to the above-mentioned configuration of the chopper amplifier circuit which includes the sample hold circuits 2 and 3, it is possible to significantly reduce the harmonic distortion in the output signal which has been obtained by chopping an input signal and synthesizing the signal after amplification, as compared with the conventional example.

Figure 8:
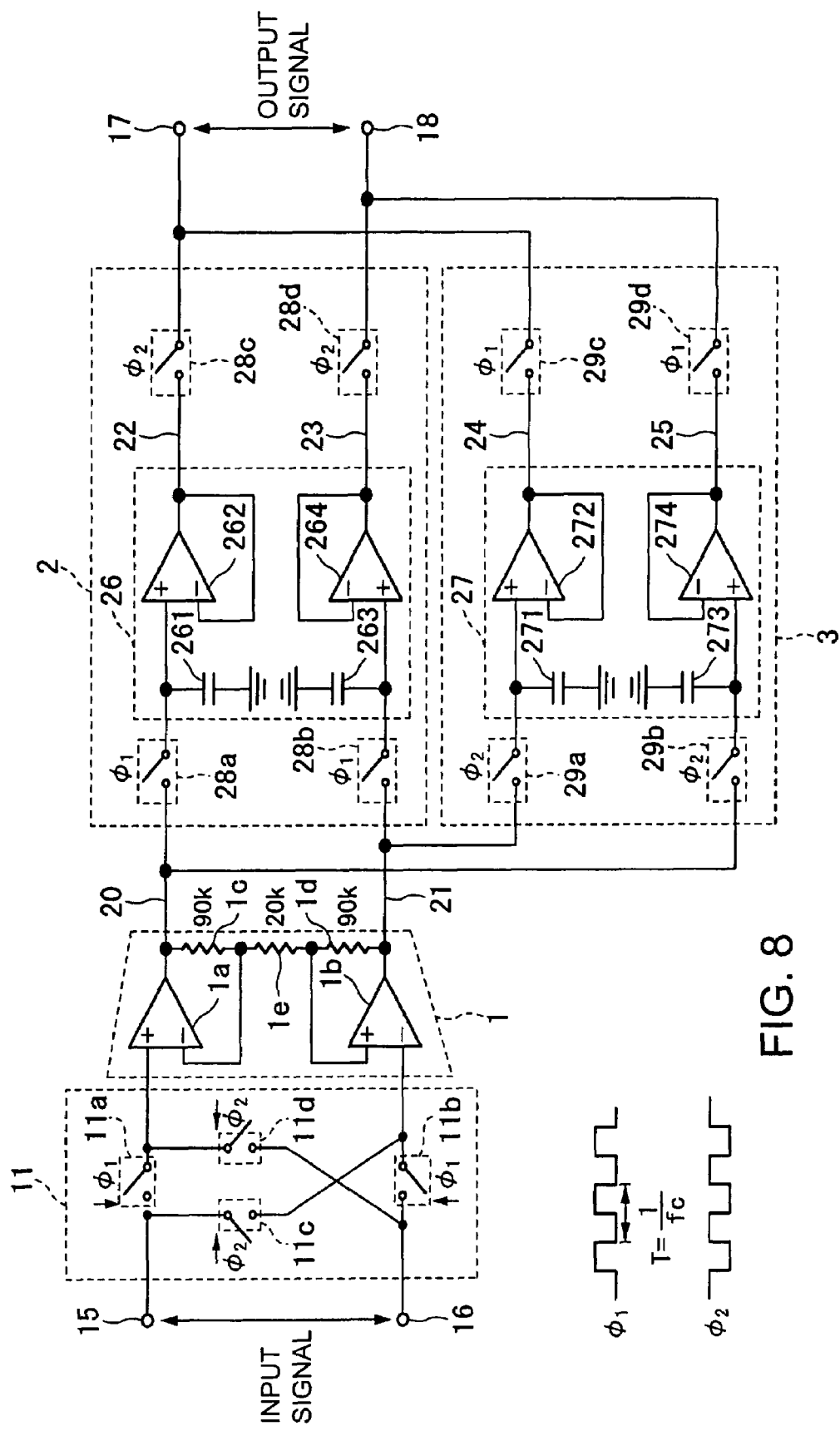
FIG. 8 is a block diagram showing in detail the configuration example of the chopper amplifier circuit according to the embodiment of the present invention.

The above-mentioned hold circuit 26 may be composed of two hold portions as shown in FIG. 8. One of the hold portions holds the voltage level of the plus (+) side output terminal 20 of the amplifier 1 and is composed of a capacitor 261 and an operational amplifier 262. The other one of the hold portions holds the voltage level of the minus (−) side output terminal 21 of the amplifier 1 and is composed of a capacitor 263 and an operational amplifier 264.

Similarly, the above-mentioned hold circuit 27 may be composed of two hold portions as shown in FIG. 8. One of the hold portions holds the voltage level of the minus (−) side output terminal 21 of the amplifier 1 and is composed of a capacitor 271 and an operational amplifier 272. The other one of the hold portions holds the voltage level of the plus (+) side output terminal 20 of the amplifier 1 and is composed of a capacitor 273 and an operational amplifier 274.

The capacitor 261 is connected at one end thereof to the plus (+) input terminal of the operational amplifier 262 while connected to the ground at the other end thereof. The capacitor 263 is connected at one end thereof to the minus (−) output terminal of the operational amplifier 262 while connected to the ground at the other end thereof. The capacitor 261 holds the voltage level of the output terminal 20 of the amplifier 1 when the switch 28a is turned on, and the capacitor 263 holds the voltage level of the output terminal 21 of the amplifier 1 when the switch 28b is turned on. The capacitor 271 is connected at one end thereof to the plus (+) input terminal of the operational amplifier 272 while connected to the ground at the other end thereof. The capacitor 273 is connected at one end thereof to the plus (+) input terminal of the operational amplifier 274 while connected to the ground at the other end thereof. The capacitor 271 holds the voltage level of the output terminal 21 of the amplifier 1 when the switch 29a is turned on, and the capacitor 273 holds the voltage level of the output terminal 20 of the amplifier 1 when the switch 29b is turned on.

The configurations of the sample hold circuits 2 and 3 are not limited to the above-mentioned configurations each using the hold circuits 26 and 27, respectively. The same effect as the above-mentioned embodiment can be obtained by using another sample hold circuit as long as the sample hold circuit has a gain equal to or larger than 1.

Also, the amplifier 1 of FIG. 8 has an amplification factor of 10 times. A resistor Ic of 90 kΩ is provided between an output terminal (output terminal 20) and a minus (−) side input terminal of an operational amplifier 1a. The operational amplifier 1a is connected at an input terminal on the plus (+) side thereof to the output side terminal of the switch 11a. A resistor 1d of 90 kΩ is provided between an output terminal (output terminal 21) and a plus (+) side input terminal of an operational amplifier 1b. The operational amplifier 1b is connected at an input terminal on the minus (−) side thereof to the output side terminal of the switch 11b. A resistor 1e of 20 kΩ is provided between a minus (−) side input terminal of the operational amplifier 1a and a plus (+) side input terminal of the operational amplifier 1b. Note that the amplification factor and the configuration of the amplifier 1 are not limited thereto.

What is claimed is:

1. A chopper amplifier circuit, comprising:
a chopper circuit for chopping an input signal based on a pulse having a predetermined frequency so as to modulate the input signal;
an amplifier for amplifying the input signal thus modulated;
a first sample hold circuit; and
a second sample hold circuit, wherein:
the chopper amplifier circuit demodulates the modulated signal thus amplified, and outputs the signal thus amplified as an output signal;
the chopper circuit chops the input signal by a first pulse and a second pulse shifted from each other in phase by a half cycle, switches a relation of connection between an input terminal pair and an output terminal pair at a timing of the chopping, and outputs the input signal as a modulated signal;
the amplifier amplifies the modulated signal and outputs the modulated signal thus amplified as an amplified signal;
the first sample hold circuit holds the amplified signal at the first pulse and outputs the amplified signal at the second pulse; and
the second sample hold circuit holds the amplified signal at the second pulse and outputs the amplified signal at the first pulse, and further wherein:
the first sample hold circuit and the second sample hold circuit each include:
a first switch pair into which the amplified signal is inputted;
a hold circuit for holding a voltage level of the amplified signal inputted from the first switch pair; and
a second switch pair for controlling an output of the amplified signal held by the hold circuit, and
one of the first switch pair and the second switch pair is turned off while the other one of the first switch pair and the second switch pair is turned on.

2. A chopper amplifier circuit according to claim 1, wherein:
the input terminal pair is composed of a first input terminal and a second input terminal;
the output terminal pair is composed of a first output terminal and a second output terminal;
the first input terminal and the first output terminal are connected to each other and the second input terminal and the second output terminal are connected to each other, when the first pulse is inputted; and
the first input terminal and the second output terminal are connected to each other and the second input terminal and the first output terminal are connected to each other, when the second pulse is inputted.

3. A chopper amplifier circuit according to claim 1, wherein the first sample hold circuit and the second sample hold circuit each hold a voltage level of the amplified signal due to a configuration of a switched capacitor.

4. A chopper amplifier circuit according to claim 1, wherein:
the first switch pair and the second switch pair, which have output terminals connected to each other, each synthesize the amplified signal outputted from each hold circuit in each of the first sample hold circuit and the second sample hold circuit based on the first pulse and the second pulse, and output the synthesized signal as an output signal.

* * * * *